United States Patent
Okada

(10) Patent No.: US 9,922,824 B2
(45) Date of Patent: Mar. 20, 2018

(54) METHOD OF FORMING SILICON FILM

(71) Applicant: TOKYO ELECTRON LIMITED, Tokyo (JP)

(72) Inventor: Mitsuhiro Okada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 85 days.

(21) Appl. No.: 14/978,328

(22) Filed: Dec. 22, 2015

(65) Prior Publication Data

US 2016/0189957 A1    Jun. 30, 2016

(30) Foreign Application Priority Data

Dec. 24, 2014   (JP) ................. 2014-260889

(51) Int. Cl.
| | |
|---|---|
| *C23C 16/24* | (2006.01) |
| *H01L 21/02* | (2006.01) |
| *H01L 21/67* | (2006.01) |
| *H01L 21/677* | (2006.01) |
| *H01L 21/3205* | (2006.01) |

(52) U.S. Cl.
CPC .... *H01L 21/02532* (2013.01); *H01L 21/0262* (2013.01); *H01L 21/02658* (2013.01); *H01L 21/32055* (2013.01); *H01L 21/67109* (2013.01); *H01L 21/67757* (2013.01); *H01L 21/02592* (2013.01)

(58) Field of Classification Search
CPC .............. C23C 16/24; C23C 16/4405
See application file for complete search history.

(56) References Cited

U.S. PATENT DOCUMENTS

| | | | | |
|---|---|---|---|---|
| 5,582,880 | A * | 12/1996 | Mochizuki | ........ H01L 29/78669 257/E21.101 |
| 5,648,293 | A * | 7/1997 | Hayama | ............ H01L 29/66765 148/DIG. 1 |
| 6,323,142 | B1 * | 11/2001 | Yamazaki | ............. C23C 16/402 257/E21.279 |
| 6,833,322 | B2 * | 12/2004 | Anderson | ............. C23C 16/402 257/E21.279 |

(Continued)

FOREIGN PATENT DOCUMENTS

| | | |
|---|---|---|
| JP | 1992290219 A | 10/1992 |
| JP | 4607347 B2 | 10/2010 |

OTHER PUBLICATIONS

Richardson, Christine Esber, et al., "Surface evolution during crystalline silicon film growth by low-temperature hot-wire chemical vapor deposition on silicon substrates". Physical Review B 73, 245328 (2006), pp. 1-9.*

(Continued)

*Primary Examiner* — Bret P Chen
(74) *Attorney, Agent, or Firm* — Nath, Goldberg & Meyer; Jerald L. Meyer

(57) ABSTRACT

A method of forming a silicon film on a target surface of a target object, including: performing a gas process on the target surface of the target object using an oxygen gas and a hydrogen gas; forming the silicon film on the target surface to which the gas process has been performed, wherein the performing a gas process and the forming the silicon film are performed within a single processing chamber.

18 Claims, 14 Drawing Sheets

(56) References Cited

U.S. PATENT DOCUMENTS

| | | | |
|---|---|---|---|
| 7,011,866 B1* | 3/2006 | Yamanaka | C23C 16/24 257/E21.101 |
| 7,173,180 B2* | 2/2007 | Shiho | C23C 18/1212 106/287.1 |
| 2006/0159859 A1* | 7/2006 | Iwasawa | C01B 33/08 427/515 |
| 2007/0190265 A1* | 8/2007 | Aoki | C01B 33/04 427/568 |
| 2008/0081106 A1* | 4/2008 | Wang | C07F 7/10 427/96.8 |
| 2012/0100310 A1* | 4/2012 | Harig | C23C 16/24 427/569 |

OTHER PUBLICATIONS

Nagasima, Naoyuki, et al., "Structures of Si Films Chemically Vapor-Deposited on Amorphous SiO2 Substrates". Japanese Journal of Applied Physics. vol. 14, No. 8, Aug. 1975, pp. 1105-1112.*

Goldfarb, V., et al., "Deposition of Thin Films and Coatings by Atmospheric Pressure Vapor Plasma Jet". Plasma Chemistry and Plasma Processing, vol. 9, No. 1, 1989 (Supplement), pp. 195S-206S.*

Kuwahara, Takuya, et al., "The reason why thin-film silicon grow layer by layer in plasma-enhanced chemical vapor deposition." Scientific Reports, 5: 9052 DOI: 10.1038/srep09052, pp. 1-7.*

* cited by examiner

<Silicon film formation condition>
Si$_2$H$_6$ gas : 350sccm  100min  380°C  133.3Pa <Silicon film formation condition>
Si$_2$H$_6$ gas : 350sccm  100min  380°C  133.3Pa

METHOD OF FORMING SILICON FILM

CROSS-REFERENCE TO RELATED APPLICATION

This application claims the benefit of Japanese Patent Application No. 2014-260889, filed on Dec. 24, 2014, in the Japan Patent Office, the disclosure of which is incorporated herein in its entirety by reference.

TECHNICAL FIELD

The present disclosure relates to a method of forming a silicon film and an apparatus therefor.

BACKGROUND

Various kinds of impurities including organic substances adhere to a target surface of a target object, e.g., a surface to be processed of a silicon wafer. Such impurities adhering to the target surface contribute to hinder a silicon raw material from adsorbing to the target surface. This degrades a nuclear generation density so that a silicon film having a random rough surface is formed on the surface of the target surface.

To address this, the impurities adhering to the target surface are removed before forming the silicon film. For example, there are known a process method which includes loading a target object into a reaction room (processing chamber), heating the interior of the reaction room at a temperature ranging from 350 to 400 degrees C., and removing impurities adhering to the target object with an oxidizing gas (oxygen gas) and a reducing gas (hydrogen gas), and an apparatus therefor.

In addition, there is known a method of forming a polycrystalline silicon film, which includes exposing a surface of a target object to an ozone atmosphere in a reaction tube, removing molecules adsorbed on the surface of the target object, and forming the polycrystalline silicon film within the reaction tube (processing chamber).

There is a desire to make a silicon film thinner in manufacturing electronic products such as semiconductor integrated circuit devices. However, the existing process performed before forming the silicon film, e.g., a cleaning process or an impurity removal process, contributes to achieve a good surface roughness for a thick silicon film, but causes a deteriorated surface roughness for a thin silicon film. Thus, it is hard to obtain a wanted high precision surface roughness.

SUMMARY

Some embodiments of the present disclosure provide a method of forming a silicon film, which is capable of achieving a high precision surface roughness even if a thin silicon film is formed, and a film formation apparatus which is capable of performing the method.

According to one embodiment of the present disclosure, there is provided a method of forming a silicon film on a target surface of a target object, including: performing a gas process on the target surface of the target object using an oxygen gas and a hydrogen gas; forming the silicon film on the target surface to which the gas process has been performed, wherein the performing a gas process and the forming the silicon film are performed within a single processing chamber.

According to another embodiment of the present disclosure, there is provided an apparatus of forming a silicon film on a target surface of a target object, which includes: a processing chamber configured to perform a process on the target object; loading/unloading part configured to load and unload the target object into and from the processing chamber; a gas supply mechanism configured to supply at least an oxygen gas, a hydrogen gas and a silicon raw material gas into the processing chamber; a heating part configured to heat the interior of the processing chamber; an exhausting part configured to exhaust the interior of the processing chamber; and a controller configured to control the loading/unloading part, the gas supply mechanism, the heating part and the exhausting part. The controller controls the loading/unloading part, the gas supply mechanism, the heating part and the exhausting part such that the method of claim 1 is performed on the target object within the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Prior to description of the embodiments of the present disclosure, the present inventor's findings will be described. A target surface of a semiconductor wafer (hereinafter, referred to as a "wafer") such as a silicon wafer as a target object is cleaned by a cleaning apparatus before forming a silicon film. A wet cleaning is used for the cleaning by the cleaning apparatus. For example, an APM (ammonium hydrogen-peroxide mixture) cleaning process using, e.g., a cleaning solution obtained by mixing an ammonia water, a hydrogen peroxide water and water is widely employed as the wet cleaning.

As is well known in the art, the APM cleaning process can remove impurities including particles or organic substances which adhere to the target surface. However, it was observed that, when the thickness of the silicon film is equal to or less than the current thickness, e.g., 2.5 nm, the APM cleaning process has a tendency to degrade a surface roughness.

The reason for this may be that, when a thinned silicon film is formed, a degree of cleanliness of the target surface does not meet a required level of surface roughness. Thus, the present inventors inferred that a time elapsed from when the cleaning process is completed till when a film formation process of the silicon film is initiated might be one of factors to disturb the degree of cleanliness of the target surface. The elapsed time corresponds to substantially the total time of a transfer time spent in transferring the wafer from the cleaning apparatus to a film formation apparatus and a waiting time at a loading area part of the film formation apparatus.

(Relationship Between Impurity Amount and Elapsed Time)

Figure 1:
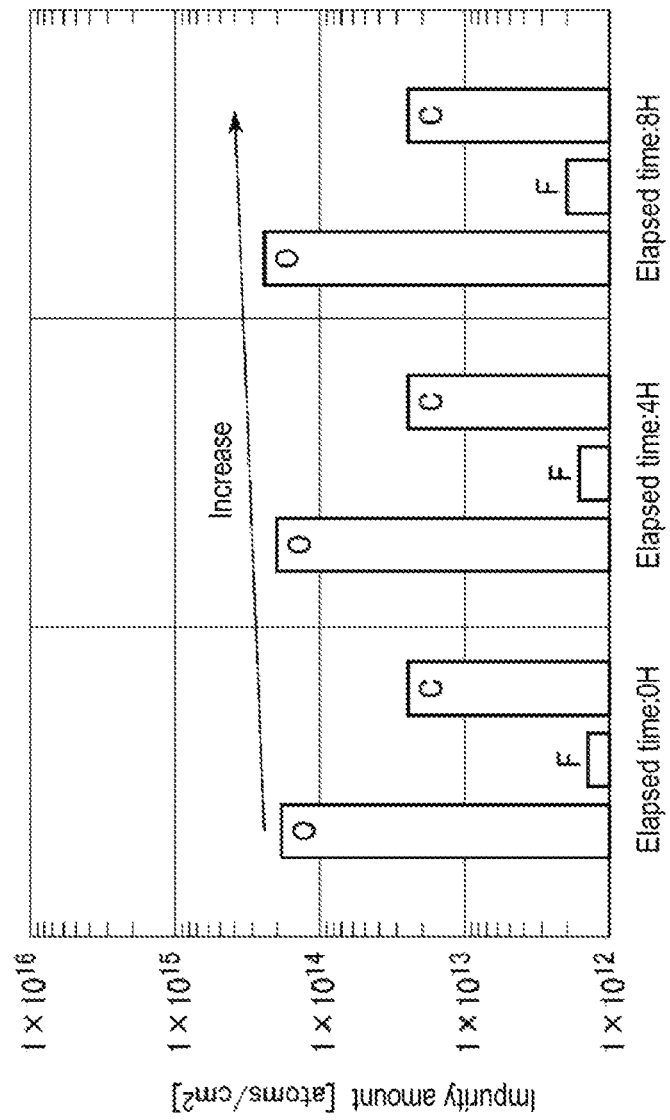
FIG. 1 is a view showing a relationship between an impurity amount on a target surface and an elapsed time.
Figure 2:
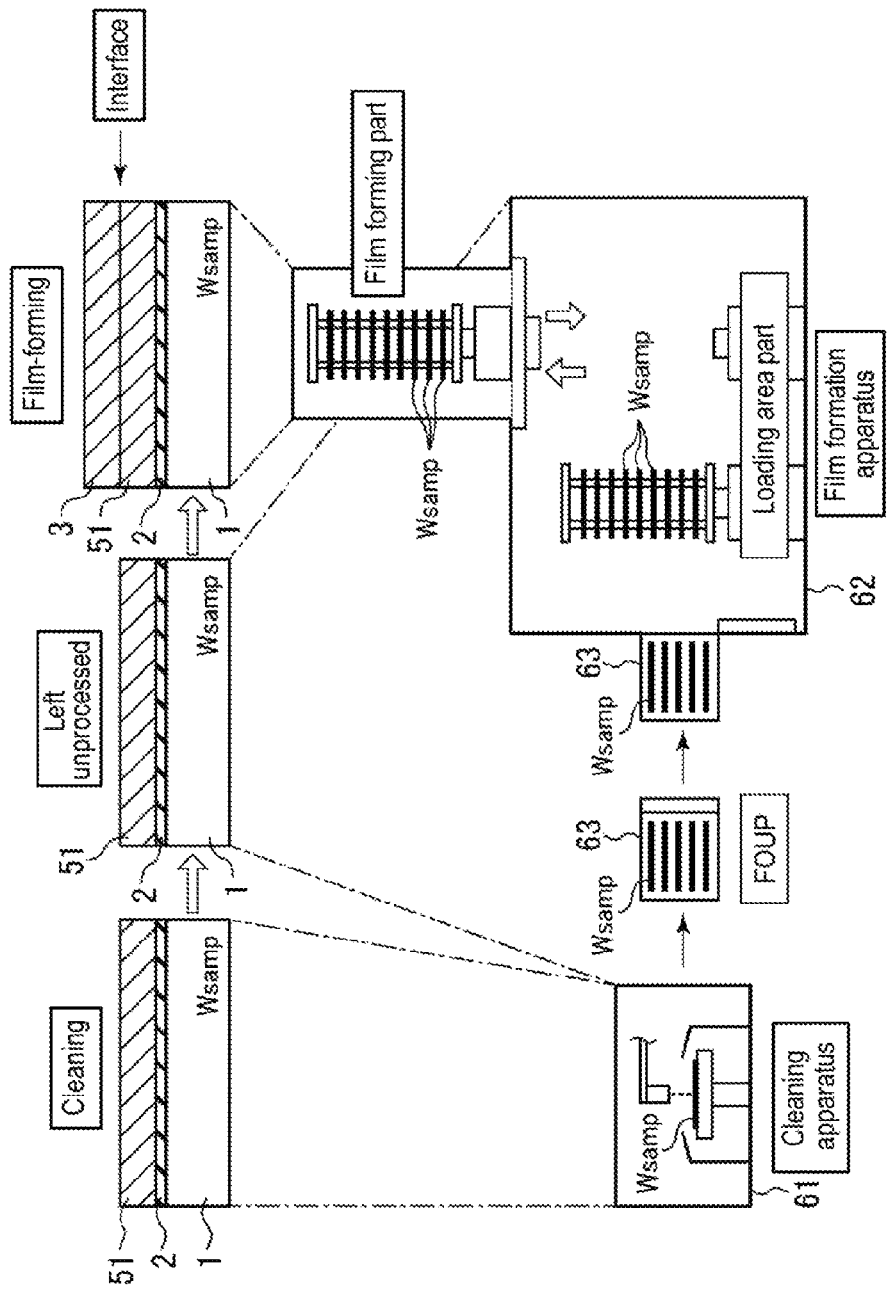
FIG. 2 is a view showing a correspondence relationship between a measurement test and an actual manufacturing process.

FIG. 1 is a view showing a relationship between an impurity amount on a target surface and an elapsed time, FIG. 2 is a view showing a correspondence relationship between a measurement test and an actual manufacturing process.

In FIG. 1, an amount of impurities such as oxygen (O), fluorine (F) and carbon (C) is listed as a function of elapsed time: zero hour (0 H), four hours (4 H) and eight hours (8 H).

In addition, as shown in FIG. 2, a sample wafer Wsamp to be used for the measurement test of the impurity amount was obtained by thermally-oxidizing a surface of a silicon wafer 1 to form a silicon oxide film 2 made of a thermal oxide, following by forming an amorphous silicon film for monitor 51 on the silicon oxide film 2. A surface of the amorphous silicon film for monitor 51 is assumed as a target surface. Subsequently, the surface of the amorphous silicon film for monitor 51 was subjected to the APM cleaning process as the wet cleaning in a cleaning apparatus 61. After the APM cleaning process, the sample wafer Wsamp was dried in the cleaning apparatus 61 using isopropylalcohol (IPA).

Thereafter, the sample wafer Wsamp, which has been subjected to the APM cleaning process and the IPA-based dry process, was left unprocessed for zero hour, four hours and eight hours. These times are applied to define the elapsed times, which are respectively obtained by considering a transfer time spent in transferring the sample wafer Wsamp from the cleaning apparatus 61 to the film formation apparatus 62 using a FOUP 63, and a waiting time at the loading area part of the film formation apparatus 62.

After the time elapse of zero hour, four hours and eight hours, an amorphous silicon film 3 was formed on the amorphous silicon film for monitor 51 by a film forming part of the film formation apparatus 62. After the amorphous silicon film 3 is formed, amounts of oxygen (O), fluorine (F), carbon (C) in the vicinity of an interface between the amorphous silicon film for monitor 51 and the amorphous silicon film 3 are analyzed using a secondary ion mass spectrometry (SIMS). The result of the analysis is shown in FIG. 1.

As shown in FIG. 1, as the elapsed time increases, the amount of the impurities in the vicinity of the interface between the amorphous silicon film for monitor 51 and the amorphous silicon film 3, i.e., in the target surface, was found to be slightly increased. Such a tendency supports that the elapsed time from when the cleaning process is completed till when the film forming process of the silicon film is initiated is closely related with the amount of the impurities. The reason for this may be that the impurities of an extremely small amount adhere to the target surface even in a clean atmosphere.

Based on this finding, the present inventors improved the silicon film formation method. Hereinafter, an improved silicon film formation method will be described as a first embodiment of the present disclosure. In the following description, like reference numerals denote like elements in the drawings.

(First Embodiment)

<Silicon Film Formation Method>

Figure 3:
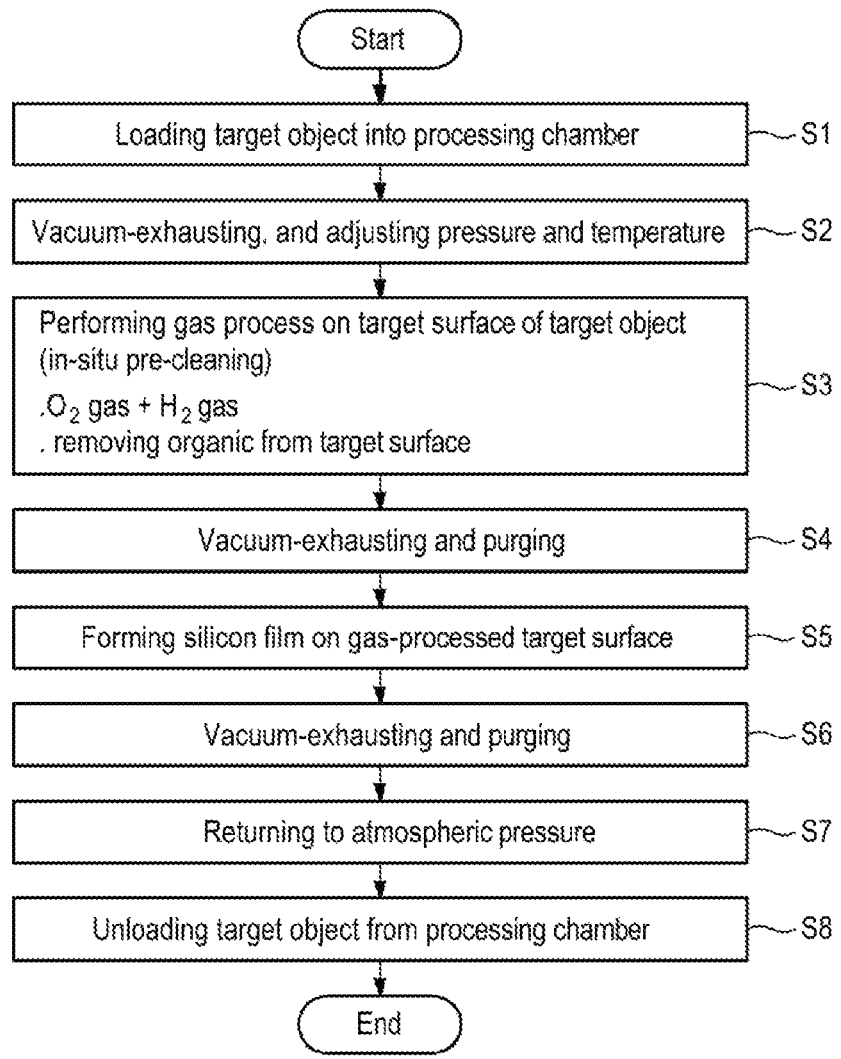
FIG. 3 is a flow chart showing an example of a silicon film formation method according to a first embodiment of the present disclosure.

FIG. 3 is a flow chart showing an example of a silicon film formation method according to the first embodiment of the present disclosure. FIGS. 4A to 4E are cross-sectional views schematically showing states of a target object during the sequence shown in FIG. 3.

Figure 4A:
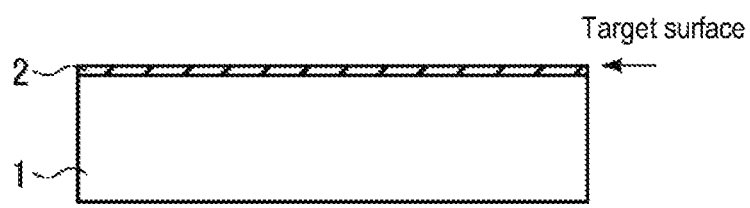
FIGS. 4A to 4E are cross-sectional views schematically showing states of a target object during the sequence shown in FIG. 3.

First, as shown in FIG. 4A, for example, the silicon wafer (hereinafter, referred to as a "wafer") 1 as a target object is prepared. The silicon oxide film 2 is formed on a surface of the wafer 1. The silicon oxide film 2 may be formed by thermally-oxidizing the wafer 1. Alternatively, the silicon oxide film 2 may be formed by depositing the silicon on the wafer 1. A surface of the silicon oxide film 2 corresponds to the target surface on which a silicon film is to be formed. The target surface is subjected to a cleaning process such as the APM cleaning process for example, so as to remove any contaminant including organic substances.

Figure 4B:
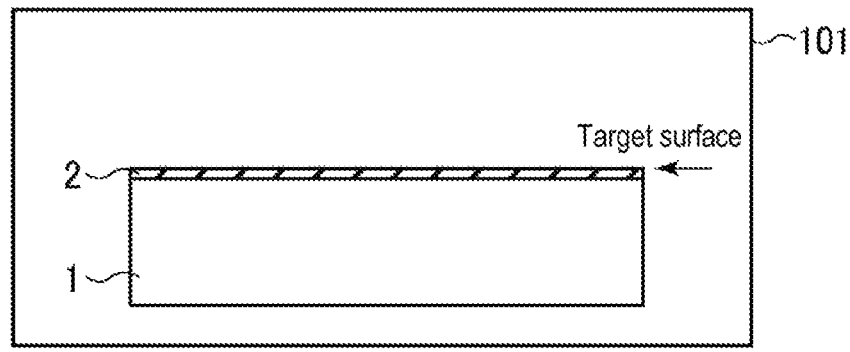

Subsequently, as shown in Step S1 of FIG. 3 and FIG. 4B, the wafer 1 which has been subjected to the cleaning process is transferred from the cleaning apparatus 61 into the film forming part of the film formation apparatus 62, i.e., a processing chamber 101 in which a film formation process is performed on the target object.

Thereafter, as shown in Step S2 of FIG. 3, the interior of the processing chamber 101 is vacuum-exhausted from atmospheric pressure such that an internal pressure of the processing chamber 101 is adjusted. In addition, an internal temperature of the processing chamber 101 may be adjusted if necessary.

Figure 4C:
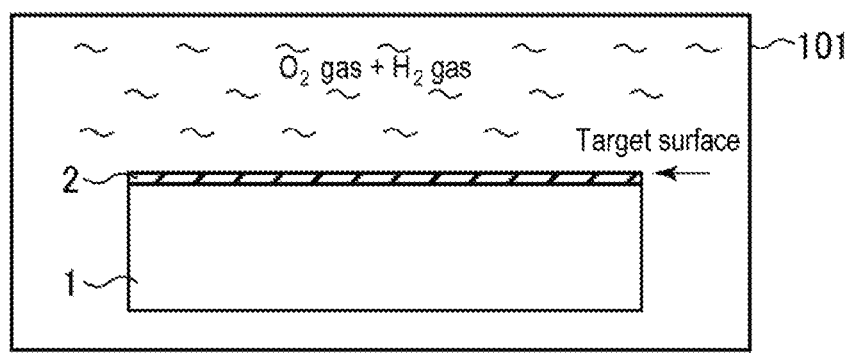

Subsequently, as shown in Step S3 of FIG. 3 and FIG. 4C, the target surface of the wafer 1 is subjected to a gas process with an oxygen ($O_2$) gas and a hydrogen ($H_2$) gas. An example of process conditions in Step S3 is as follows:

Flow rate of $O_2$ gas: 1,700 sccm
Flow rate of $H_2$ gas: 1,000 sccm
Process time: 30 to 180 min
Process temperature: 300 degrees C.

Process pressure: about 47 Pa (0.35 Torr)
(wherein, 1 Torr is defined as 133.3 Pa).

The gas process performed in Step S3 removes the impurities including the organic substances from the target surface of the wafer 1, i.e., the surface of the silicon oxide film 2 in this embodiment. Step S3 is an operation called an in-situ pre-cleaning, which performs the cleaning process inside a processing chamber after a cleaning process (pre-cleaning) using an external cleaning apparatus and before the formation of a silicon film.

(Removal Situation of Organic Substances and Oxidation Situation of Target Object)

<Removal Situation of Organic Substances>

Two kinds of gases can be used in Step S3. One is the ozone ($O_3$) gas and the other is a mixed gas of the oxygen ($O_2$) gas and the hydrogen ($H_2$) gas.

In order to check the removal situation of the organic substances, the target surface of the sample wafer is forcibly polluted with dioctyl phthalate (hereinafter, referred to as a "DOP") as the organic substance. Thereafter, the removal situation of DOP was observed by performing the gas process using each of the gases. The removal situation of DOP was observed under the conditions as follows:

Without gas process $O_3$ gas-based process (300 degrees C., 5 min, $O_3$=200 g/Nm$^3$)

($O_2$ gas+$H_2$ gas)-based process (300 degrees C., 30 min, $H_2$=10%)

The number of scattered DOP resolvents was measured using a time-of-flight secondary ion mass spectrometry (TOF-SIMS).

Figure 5:
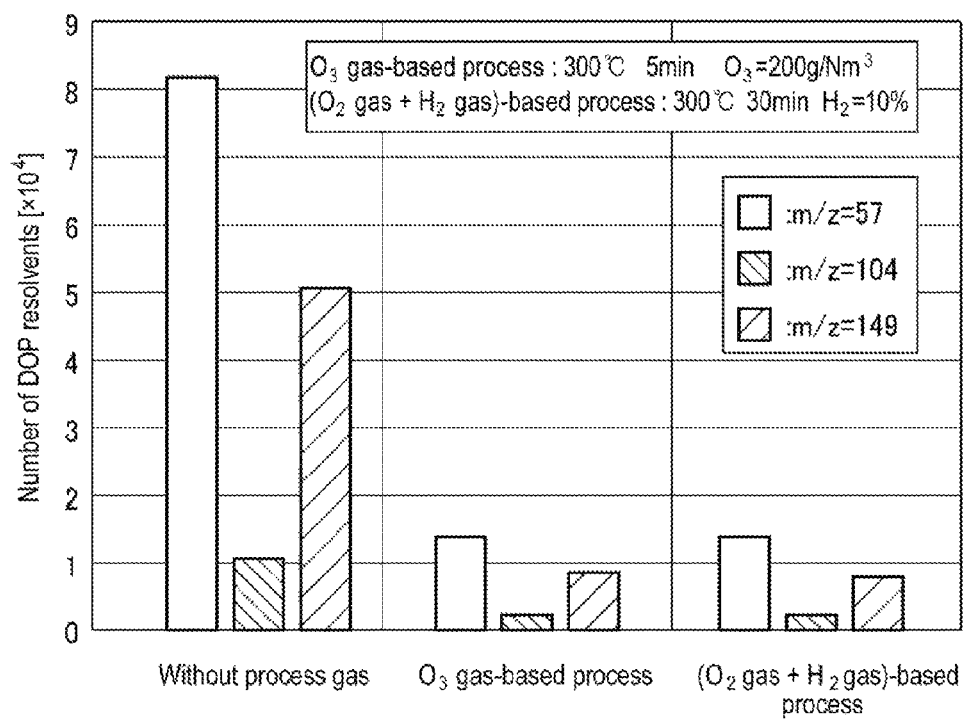
FIG. 5 is a view showing measurement results of the number of DOP resolvents.
Figure 6:
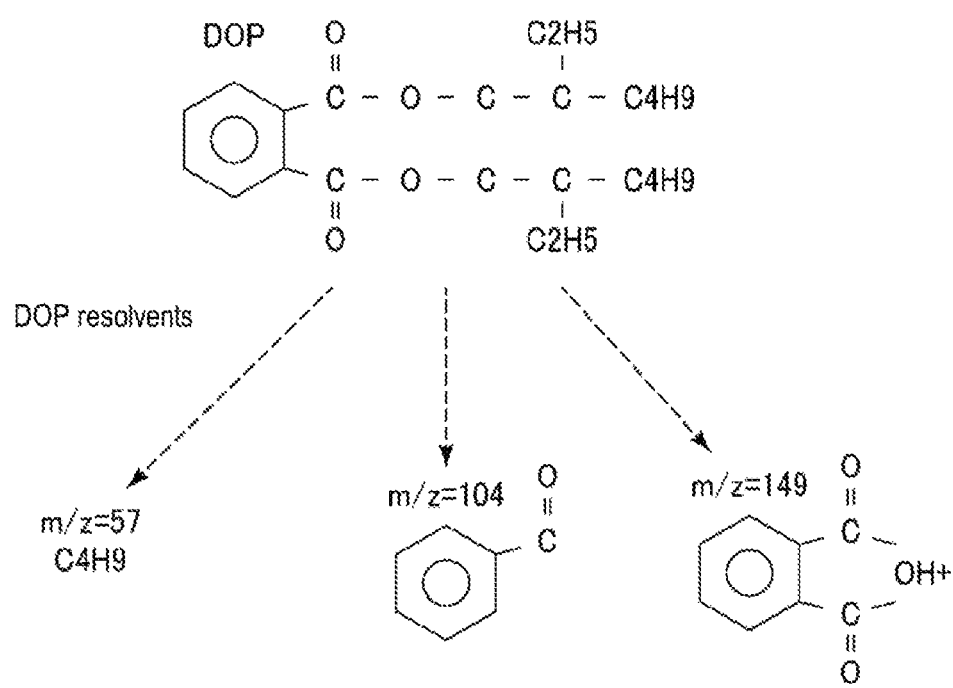
FIG. 6 is a view showing DOP and measured DOP resolvents.

FIG. 5 is a view showing measurement results of the number of DOP resolvents, and FIG. 6 is a view showing DOP and measured DOP resolvents.

As shown in FIG. 5, for a sample wafer which was not subjected to the gas process, it was observed that the number of DOP resolvents m/z=7 is about 80,000, the number of DOP resolvents m/z=104 is about 10,000, and the number of DOP resolvents m/z=149 is about 50,000.

Meanwhile, for a sample wafer which was subjected to the gas process using the $O_3$ gas, and the $O_2$ gas+$H_2$ gas, it was observed that the number of DOP resolvents m/z=57 is decreased up to about 12,000 to 13,000, the number of DOP resolvents m/z=104 is decreased up to about 2,000, and the number of DOP resolvents m/z=149 is decreased up to about 7,000 to 8,000.

From this observation, it was observed that the removal effect of the organic substances is an approximately equivalent level for both the $O_3$ gas-based process and the ($O_2$ gas+$H_2$ gas)-based process.

<Oxidation Situation of Target Object>

Subsequently, an oxidation power of each of the ozone gas and the mixed gas of the oxygen gas and the hydrogen gas was observed.

The oxidation power was observed by oxidizing a bare silicon, e.g., the silicon wafer 1, under conditions as follows, and measuring a film thickness of a silicon oxide film formed on a surface of the bare silicon:

Bare silicon as is $O_3$ gas-based process (300 degrees C., 5 min, $O_3$=200 g/Nm$^3$)

($O_2$ gas+$H_2$ gas)-based process (300 degrees C., 30 min, $H_2$=10%)

Figure 7:
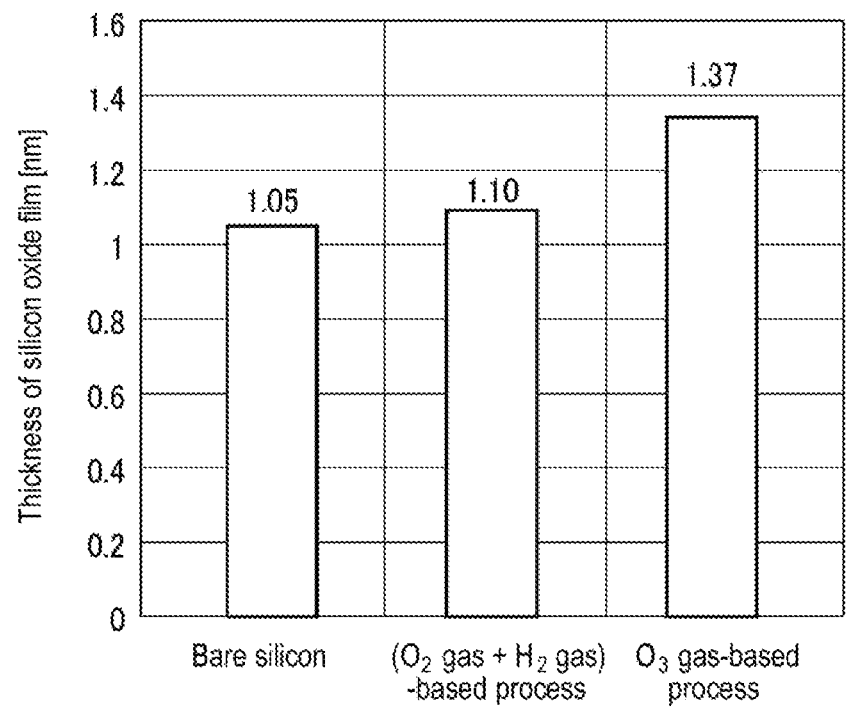
FIG. 7 is a view showing measurement results of a film thickness of a silicon oxide film.

FIG. 7 is a view showing measurement results of the film thickness of the silicon oxide film.

As shown in FIG. 7, a natural silicon oxide film having a thickness of about 1.05 nm is formed on the surface of the bare silicon as is. When the bare silicon is subjected to the ($O_2$ gas+$H_2$ gas)-based process, a silicon oxide film having a thickness of about 1.10 nm was formed on the surface of the bare silicon. When the bare silicon is subjected to the $O_3$ gas-based process, a silicon oxide film having a thickness of about 1.37 nm was formed on the surface of the bare silicon.

From this result, it was observed that the ozone gas has a strong oxidation power relative to the mixed gas of the oxygen gas and the hydrogen gas.

Since the film thickness of the silicon oxide film formed by the ($O_2$ gas+$H_2$ gas)-based process is about 1.1 nm, a difference of 0.05 nm is obtained with respect to the film thickness (about 1.05 nm) of the natural silicon oxide film. This manifests that the mixed gas of the oxygen gas and the hydrogen gas provides an oxidation power slightly higher than atmosphere but has a little difference in oxidation power relative to the natural silicon oxide film, so that the oxidation power obtained by the ($O_2$ gas+$H_2$ gas)-based process is very delicate.

In contrast, a film thickness of the silicon oxide film formed by the $O_3$ gas-based process was about 1.37 nm, which causes a difference of 0.32 nm relative to the film thickness (about 1.05 nm) of the natural silicon oxide film. In other words, the $O_3$ gas-based process oxidizes the bare silicon about six times or more than the ($O_2$ gas+$H_2$ gas)-based process. As described above, the ozone gas provides the oxidation power extremely stronger than that of the mixed gas of the oxygen gas and the hydrogen gas.

Both the ozone gas and the mixed gas of the oxygen gas and the hydrogen gas are effective in removing the organic substances as shown in FIG. 5. However, the ozone gas provides the extremely strong oxidation power relative to the mixed gas of the oxygen gas and the hydrogen gas. As such, it is likely that the target surface on which the silicon film is to be formed is rough uselessly. In order to form a thinned silicon film (e.g., a silicon film having a target film thickness of 2.5 nm or less) on a target surface, it is desirable to suppress the roughness of the target surface as small as possible.

In addition, during the formation of the silicon film, the silicon film may be formed on an unexpected place, e.g., an inner wall of the processing chamber 101 or the like. The silicon film formed on the unexpected place is not a film which is formed on a predesigned place. Thus, such an unexpected silicon film has a poor film quality relative to the silicon film formed on the target surface. Once the unexpected silicon film having the poor film quality is oxidized with the ozone gas having the strong oxidation power, the film may be peeled off and dropped down, thereby generating particles. Once the particles generated inside the processing chamber 101 adhere to the target surface, a film quality of the formed silicon film is deteriorated, thereby degrading a surface roughness.

Accordingly, in the gas process (Step S3) that is performed before forming the thinned silicon film, it is desirable to use the mixed gas of the oxygen gas and the hydrogen gas having a relatively weak oxidization power compared to the ozone gas, as described in this embodiment. This suppresses deterioration in the film quality of the formed silicon film and degradation in the surface roughness as compared to the case where the ozone gas is used.

In addition, the use of the mixed gas in the gas process provides the advantage that the oxidation power can be adjusted compared to the case where the ozone gas is used. For example, by increasing a flow rate of the hydrogen gas and decreasing a flow rate of the oxygen gas, it is possible to make the oxidation power of the mixed gas weak. In contrast, by decreasing the flow rate of the hydrogen gas and increasing the flow rate of the oxygen gas, it is possible to make the oxidation power of the mixed gas strong. Further, it is possible to extremely delicately adjust the oxidation power. This is because that the oxidation power of the mixed gas itself is weak.

Thereafter, as shown in Step S4 of FIG. 3, the processing chamber 101 is vacuum-exhausted and subsequently, the interior thereof is purged with an inert gas, e.g., a nitrogen ($N_2$) gas.

Figure 4D:
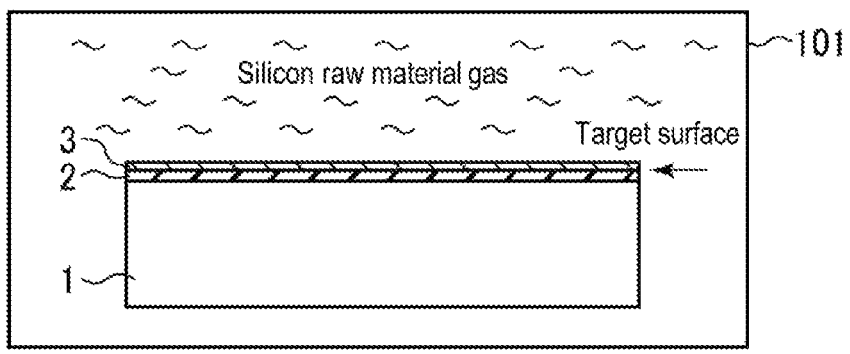

Subsequently, as shown in Step S5 of FIG. 3 and FIG. 4D, the silicon film 3 is formed on the target surface of the wafer 1 which has been subjected to the gas process. A well-known silicon raw material gas may be used as the silicon raw material gas. In this embodiment, a disilane ($Si_2H_6$) gas was used. An example of process conditions in Step S5 is as follows:

Flow rate of $Si_2H_6$ gas: 350 sccm
Process time: 100 min
Process temperature: 380 degrees C.
Process pressure: 133.3 Pa (1 Torr)

By Step S5, the silicon film 3 having a thickness of about 5.09 to 5.19 nm is formed on the target surface of the wafer 1, i.e., the surface of the silicon oxide film 2 in this embodiment. In addition, the silicon film 3 formed under the aforementioned process conditions is not a polycrystalline silicon film and is an amorphous silicon film.

Thereafter, as shown in Step S6 of FIG. 3, the processing chamber 101 is vacuum-exhausted and subsequently, is purged with the inert gas, e.g., the nitrogen ($N_2$) gas.

Subsequently, as shown in Step S7 of FIG. 3, the internal pressure of the processing chamber 101 is returned to the atmospheric pressure.

Figure 4E:
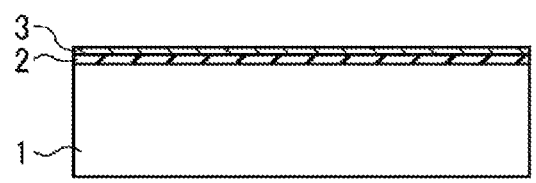

Subsequently, as shown in Step S8 of FIG. 3 and FIG. 4E, the wafer 1 with the silicon film 3 formed thereon is unloaded from the processing chamber 101. In this way, the silicon formation sequence of the silicon film formation method according to the first embodiment is finished.

<Relationship Between Gas Process Time and Film Thickness of Silicon Film>

Figure 8:
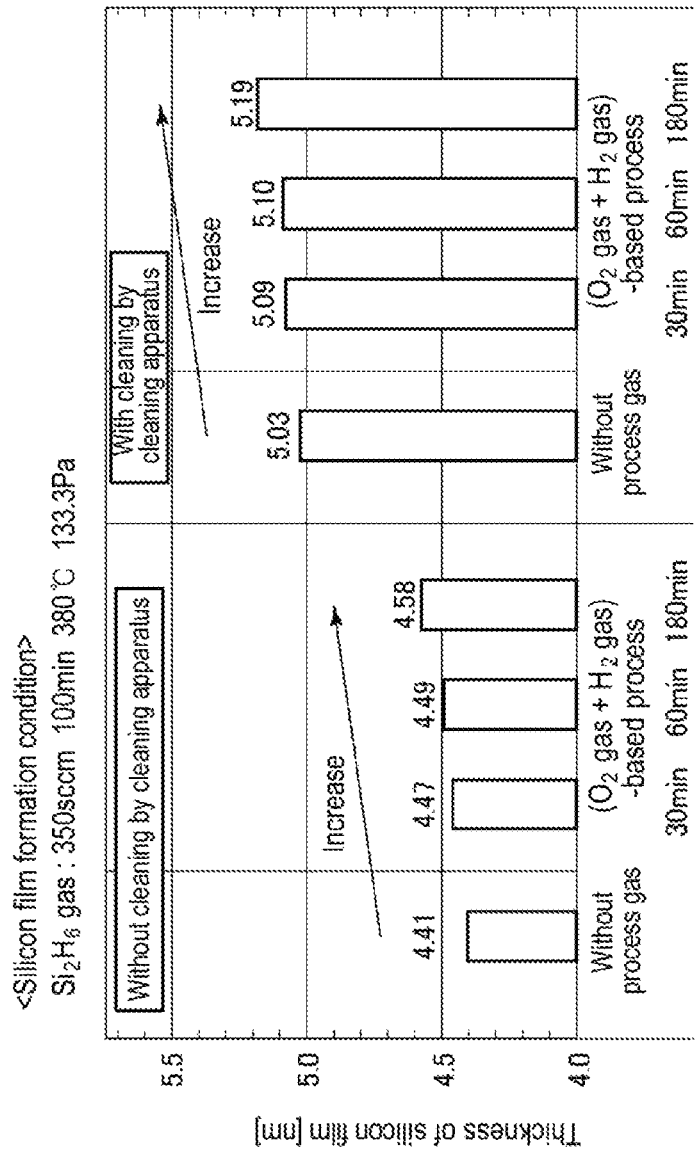
FIG. 8 is a view showing a relationship between a gas process time and a film thickness of a silicon film.

FIG. 8 is a view showing a relationship between a gas process time and a film thickness of a silicon film.

In FIG. 8, there are shown two examples in which one is the case where the cleaning process by the cleaning apparatus 61 has not previously been performed on the target surface of the wafer 1 ("Without cleaning by cleaning apparatus") and the other is the case where the cleaning process by the cleaning apparatus 61 has been performed on the target surface of the wafer 1 ("With cleaning by cleaning apparatus"). The cleaning process performed in the cleaning apparatus 61 is the APM cleaning process in this embodiment.

Further, an example of conditions of the gas process is as follows:

Flow rate of $O_2$ gas: 1,700 sccm
Flow rate of $H_2$ gas: 1,000 sccm
Process time: 30 min
Process temperature: 300 degrees C.
Process pressure: about 47 Pa (0.35 Torr)

In addition, an example of film formation conditions of the silicon film is shown in FIG. 8.

As shown in FIG. 8, in both cases of "Without cleaning by cleaning apparatus" written in the left side and "With cleaning by cleaning apparatus" written in the right side, a film thickness of the silicon film formed for a film formation time of, e.g., 100 min becomes thicker in the case of "the ($O_2$ gas+$H_2$ gas)-based process" rather than the case of "without gas process." This shows that an incubation time of the silicon film is shortened by the gas process.

In addition, the incubation time of the silicon film is shortened irrespective of the presence or absence of the cleaning process by the cleaning apparatus 61, which supporting that the "gas process" shown in Step S3 of FIG. 3 is effective. In other words, by performing the gas process shown in Step S3, it is possible to remove the impurities including the organic substances from the target surface of the wafer 1 irrespective of the presence or absence of the cleaning process by the cleaning apparatus 61. This further improves the degree of cleanliness of the target surface compared to the case where the gas process is not performed, thus contributing to reduce the film thickness of the silicon film.

In addition, the film thickness of the silicon film, which is formed for the film formation time of 100 min, becomes thicker as a period of time during which the gas process is performed (hereinafter, referred to as a "gas process time") is prolonged. This means that the degree of cleanliness of the target surface of the wafer 1 depends on the gas process time. Thus, it is possible to control the degree of cleanliness of the target surface of the wafer 1 by adjusting the gas process time. In other words, to further improve the degree of cleanliness of the target surface of the wafer 1 requires prolonging the gas process time.

Furthermore, the shortening of the incubation time means that a nuclear generation density of the silicon on the target surface of the wafer 1 is increased. Such an increase in the nuclear generation density of the silicon improves the surface roughness of the silicon film compared to the case where nucleus are sparsely generated.

<Relationship Between Gas Process Time and Surface Roughness Ra of Silicon Film>

Figure 9:
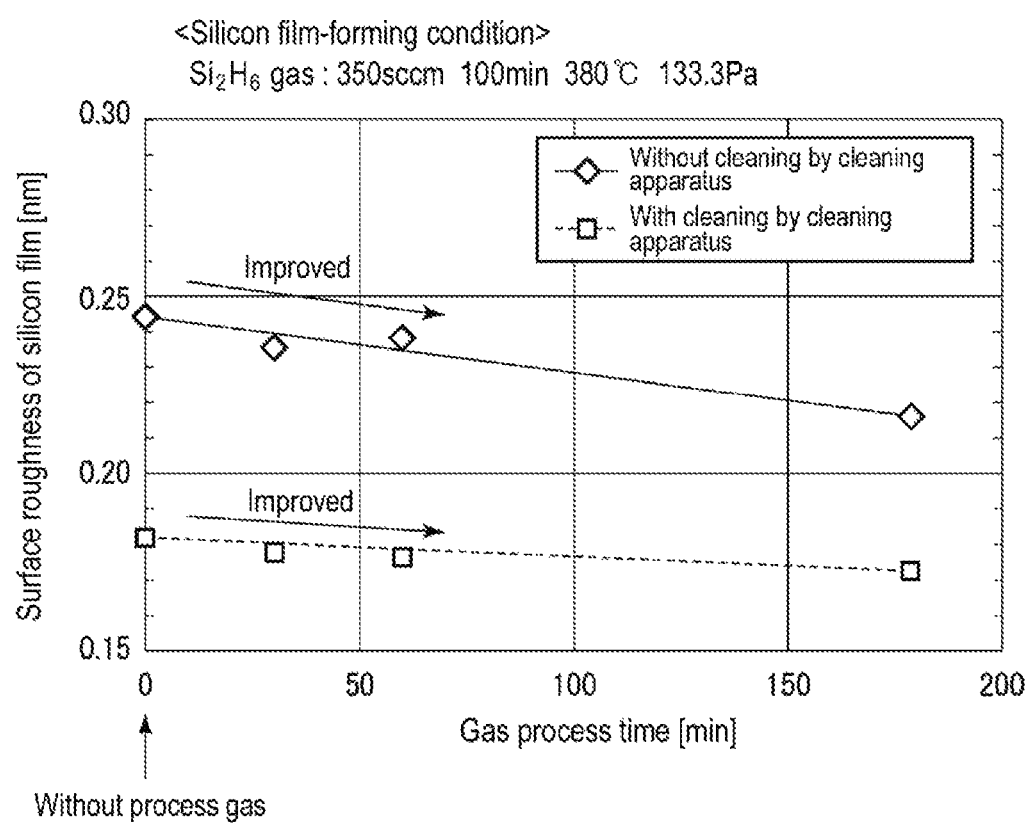
FIG. 9 is a view showing a relationship between a gas process time and a surface roughness Ra of a silicon film.

FIG. 9 is a view showing a relationship between the gas process time and the surface roughness Ra of the silicon film.

As shown in FIG. 9, it was observed that the surface roughness Ra of the silicon film is improved compared to the case where the gas process is not performed. The surface roughness Ra also depends on the gas process time. Thus, the surface roughness Ra is further improved as the gas process time is prolonged. That is to say, the surface roughness Ra of the silicon film is closer to the surface roughness Ra of the wafer 1 (i.e., a surface roughness Ra of the target surface of the wafer 1).

As described above, in the silicon film formation method according to the first embodiment, the gas process is performed on the target surface using the mixed gas of the $O_2$ gas and the $H_2$ gas inside the single processing chamber, before forming the silicon film 3 on the target surface of the wafer 1. This shortens the incubation time of the silicon film 3, thus improving the surface roughness Ra of the formed silicon film 3 to the extent of, e.g., the original surface roughness Ra of the wafer 1 on which the respective silicon film 3 is formed.

Therefore, according to the silicon film formation method of the first embodiment, it is possible to achieve a high precision surface roughness even if a thin silicon film is formed.

Furthermore, according to the silicon film formation method of the first embodiment, it was observed that an in-plane uniformity of the silicon film is also improved.

<Relationship Between Gas Process Time and In-plane Uniformity of Silicon Film>

Figure 10:
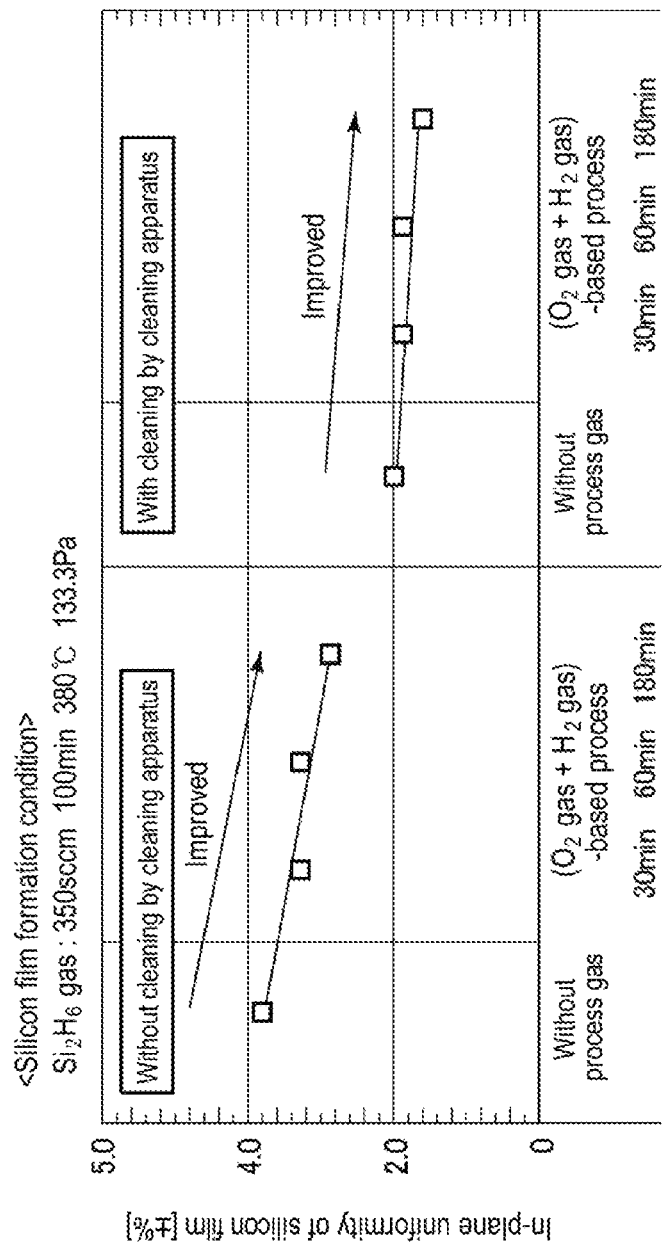
FIG. 10 is a view showing a relationship between a gas process time and an in-plane uniformity of a silicon film.

FIG. 10 is a view showing a relationship between the gas process time and an in-plane uniformity of the silicon film.

As shown in FIG. 10, the gas process also further improves the in-plane uniformity of the silicon film (in-plane of the wafer 1) compared to the case where the gas process is not performed. This means that the further improvement of the in-plane uniformity of the silicon film supports an increase in diameter of the wafer, which will be progressed in future.

Further, the in-plane uniformity of the silicon film also depends on the gas process time. Thus, by prolonging the gas process time, it is possible to obtain better in-plane uniformity.

In addition, the prolonging of the gas process time shortens the incubation time and improves both the surface roughness Ra and the in-plane uniformity of the silicon film, thereby supporting a reduction in film thickness of the silicon film. However, increasing the gas process time longer-than-necessary degrades throughput unnecessarily. For this reason, the gas process time may be set to be equal to or less than 180 min, from the viewpoint of a practical usage such as a "manufacture of semiconductor integrated circuit devices."

On the other hands, when the gas process time is excessively shortened due to fears of deterioration in throughput, the effect called "the improvement of the degree of cleanliness of the target surface" becomes reduced. Thus, in order to obtain a more effective effect, the gas process time needs to set to be 30 min or more.

(Second Embodiment)

This second embodiment relates to an example of a film formation apparatus which is capable of performing the silicon film formation method according to the first embodiment.

Figure 11:
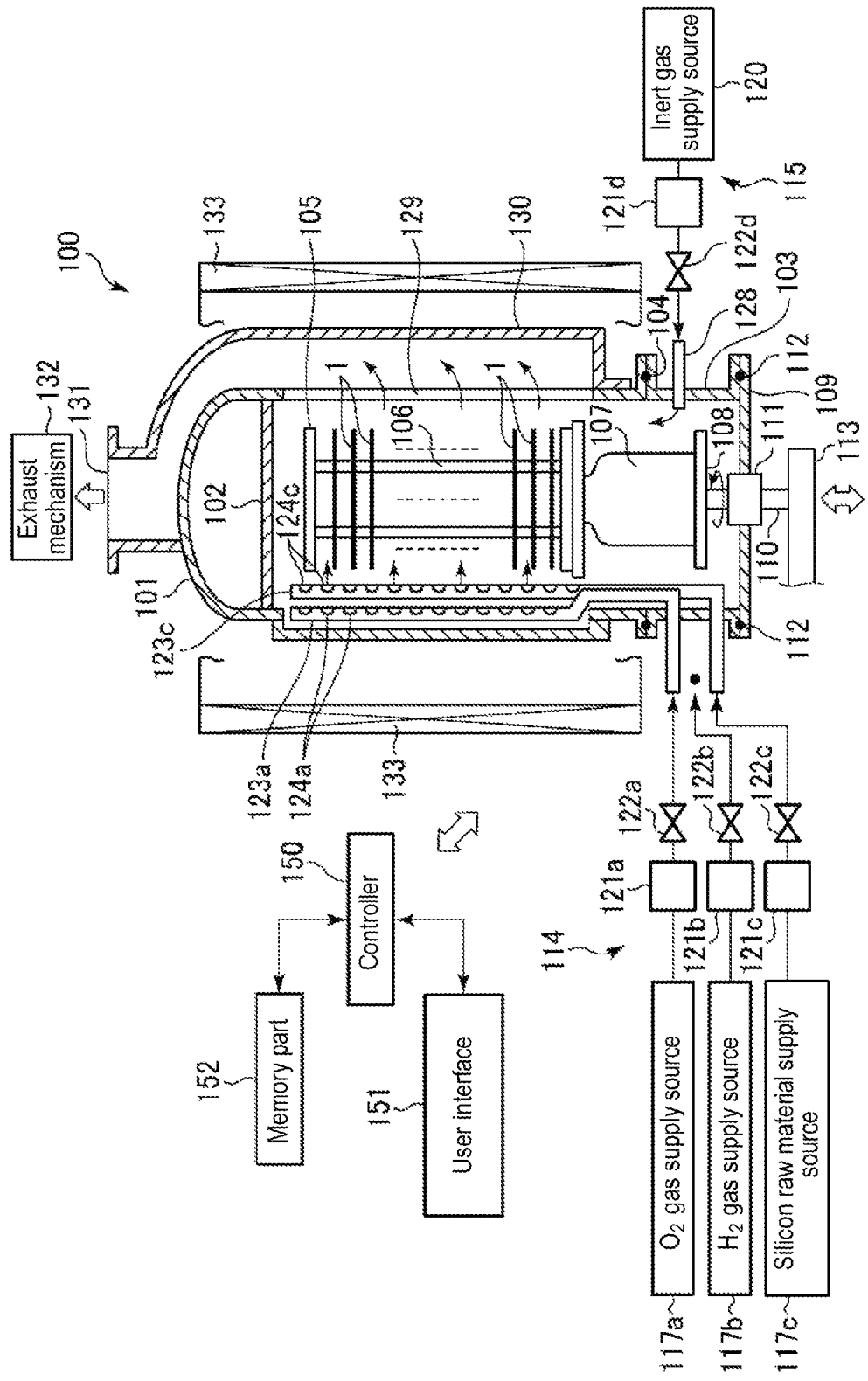
FIG. 11 is a sectional view schematically showing an example of a film formation apparatus according to a second embodiment of the present disclosure.

FIG. 11 is a sectional view schematically showing the example of the film formation apparatus according to the second embodiment of the present disclosure.

As shown in FIG. 11, a film forming apparatus 100 includes the cylindrical processing chamber 101 having a ceiling with a bottom end opened. The entirety of the processing chamber 101 is formed of, e.g., quartz. A quartz ceiling plate 102 is located at the ceiling inside the processing chamber 101. Also, for example, a manifold 103, which is formed of a stainless steel to have a cylindrical shape, is connected to a lower end opening portion of the processing chamber 101 through a sealing member 104 such as an O-ring.

The manifold 103 supports a lower end of the processing chamber 101. A vertical wafer boat 105 of quartz, on which a plurality of (e.g., 50 to 100) semiconductor wafers (the silicon wafers 1, in this embodiment) W is mounted as the target objects in a height direction, is insertable into the processing chamber 101 through a lower portion of the manifold 103. The wafer boat 105 includes a plurality of supporting pillars 106, and the plurality of wafers W is supported by grooves (not shown) which are formed in each of the supporting pillars 106.

The vertical wafer boat 105 is loaded on a table 108 with a heat insulating tube 107 of quartz interposed therebetween the vertical wafer boat 105 and the table 108. The table 108 is supported on a rotation shaft 110 that passes through a cover part 109. The cover part 109 is made of, e.g., a stainless steel, and opens or closes a lower end opening portion of the manifold 103. For example, a magnetic fluid seal 111 is disposed at a through portion of the rotation shaft 110. The magnetic fluid seal 111 closely seals and rotatably supports the rotation shaft 110. Also, for example, a seal member 112 such as an O-ring is disposed between a periphery of the cover part 109 and a lower end portion of the manifold 103, thus maintaining sealability in the processing chamber 101. The rotation shaft 110, for example, is disposed at a front end of an arm 113 that is supported by an ascending/descending instrument such as a boat elevator. Accordingly, the wafer boat 105 and the cover part 109 are elevated in an integrated manner to be inserted into and separated from the processing chamber 101.

The film formation apparatus 100 includes a process gas supply mechanism 114 configured to supply a process gas into the processing chamber 101 and an inert gas supply mechanism 115 configured to supply an inert gas into the processing chamber 101.

The process gas supply mechanism 114 includes an $O_2$ gas supply source 117a, an $H_2$ gas supply source 117b and a silicon raw material gas supply source 117c.

In this embodiment, the $O_2$ gas supply source 117a, the $H_2$ gas supply source 117b and the silicon raw material gas supply source 117c supply the $O_2$ gas, the $H_2$ gas and the $Si_2H_6$ gas used as the silicon raw material gas into the processing chamber 101, respectively.

The inert gas supply mechanism 115 includes an inert gas supply source 120. The inert gas supply source 120 is configured to supply the $N_2$ gas used as the inert gas into the processing chamber 101.

The $O_2$ gas supply source 117a is coupled to a dispersion nozzle 123a through a flow rate controller 121a and an on-off valve 122a. Similarly, the $H_2$ gas supply source 117b is coupled to a dispersion nozzle 123b (not shown) through a flow rate controller 121b and an on-off valve 122b. Similarly, the silicon raw material gas supply source 117c is coupled to a dispersion nozzle 123c through a flow rate controller 121c and an on-off dialect 122c.

Each of the dispersion nozzles 123a to 123c is made of a quartz pipe, which pierces through a sidewall of the manifold 103 inward, bends upward and extends vertically. At a vertical portion of each of the dispersion nozzles 123a to 123c, a plurality of gas discharge holes 124a to 124c are formed spaced apart from each other at a predetermined interval, respectively. The $O_2$ gas, the $H_2$ gas and the silicon raw material gas respectively are discharged in an approximately uniform manner from the respective gas discharge holes 124a to 124c into the processing chamber 101 in the horizontal direction.

The inert gas supply source 120 is coupled to a nozzle 128 through a flow rate controller 121d and an on-off valve 122d. The nozzle 128 penetrates through the sidewall of the manifold 103 and horizontally discharges the inert gas from the tip thereof into processing chamber 101.

An exhaust vent 129 configured to exhaust gas from the processing chamber 101 is formed in a portion opposite to the dispersion nozzles 123a to 123c in the processing chamber 101. The exhaust vent 129 has an elongated shape formed by chipping the sidewall of the processing chamber 101 in the vertical direction. At a portion corresponding to the exhaust vent 129 of the processing chamber 101, an exhaust vent cover member 130 with a C-shaped section is installed by welding to cover the exhaust vent 129. The exhaust vent cover member 130 extends upward along the sidewall of the processing chamber 101, and defines a gas outlet 131 at the top of the processing chamber 101. An exhaust mechanism 132 equipped with a vacuum pump and the like is connected to the gas outlet 131. The exhaust mechanism 132 exhausts the processing chamber 101 so as to discharge the process gas used for the process so that an internal pressure of the processing chamber 101 is adjusted to a predetermined process pressure.

A cylindrical heating part 133 is installed on the outer periphery of the processing chamber 101. The heating part 133 activates the process gas supplied into the processing chamber 101, and heats the target objects (the wafers 1 in this embodiment) loaded in the processing chamber 101.

Respective parts of the film formation apparatus 100 are controlled by a controller 150 including, for example, a microprocessor (computer). The controller 150 is connected to a user interface 151. The user interface 151 includes an input part including a touch panel display, a keyboard or the like for inputting, by an operator, a command to control the film formation apparatus 100, and a display part including a display or the like for visually displaying an operation state of the film formation apparatus 100.

A memory part 152 is connected to the controller 150. The memory part 152 stores a control program for executing various processes in the film formation apparatus 100 under the control of the controller 150, and a program (i.e., a recipe) for executing processes in the respective parts of the film formation apparatus 100 according to process conditions. For example, the recipe is stored in a memory medium of the memory part 152. The memory medium may include a hard disk, a semiconductor memory, or a portable memory such as a CD-ROM, a DVD, a flash memory or the like. The recipe may be suitably transmitted from other device through a dedicated line. If necessary, the recipe is read from the memory part 152 in response to a command received from the user interface 151, and the controller 150 executes a process according to the read recipe. Accordingly, the film formation apparatus 100 performs a desired process under the control of the controller 150.

In this embodiment, the silicon film formation method according to the first embodiment is performed under the control of the controller 150. The silicon film formation method according to the first embodiment can be performed by the film formation apparatus 100 as shown in FIG. 11.

(Third Embodiment)

The third embodiment relates to examples of an approach that may be employed in performing the silicon film formation method according to the first embodiment. In addition, it is to be understood that the approach described in the third embodiment can be performed by the film formation apparatus 100 described in the second embodiment.

<First Example: Gas Process Temperature>

In some embodiments, a gas process temperature may be set to be equal to or less than a film forming temperature of the silicon film 3. In a process of forming the silicon film 3, an unexpected silicon film may be deposited on a surface of a wafer boat (e.g., the vertical wafer boat 105), an inner wall of the processing chamber 101 or the like, in addition to the target surface of the wafer 1. When the gas process is performed while the unexpected silicon film is deposited on the interior of the processing chamber 101 in which the silicon film 3 is formed, a volatile compound that was not able to volatilize at the film formation temperature of the silicon film 3 sometimes volatilizes, thereby generating gas. The gas generated from the unexpected silicon film reacts with, e.g., atmosphere of the gas process, thus generating particles in the interior of the processing chamber 101. When such particles adhere to the target surface of the wafer 1, it is likely that a film quality of the silicon film 3 formed on the target surface is degraded.

Figure 12:
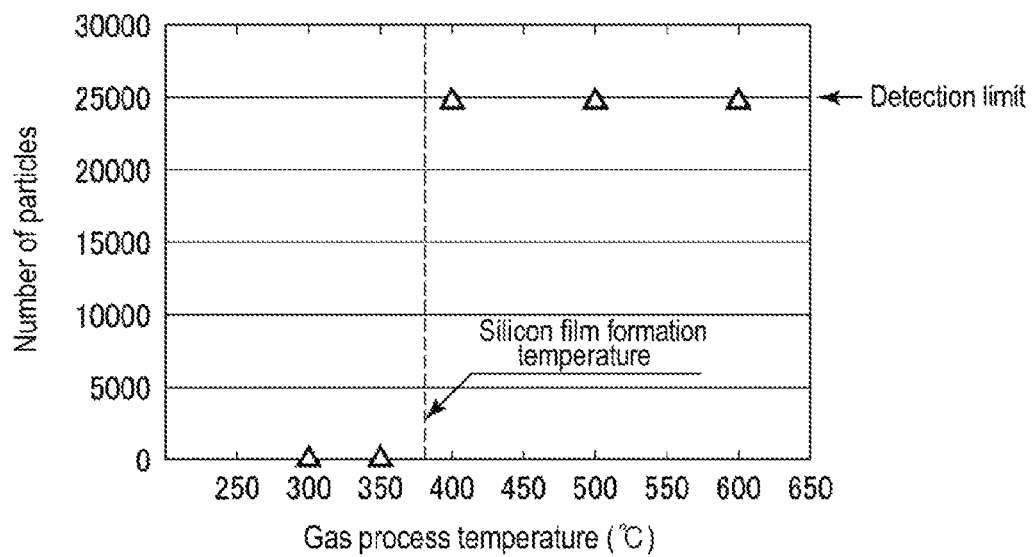
FIG. 12 is a view showing a relationship between a gas process temperature and the number of particles inside a processing chamber.

FIG. 12 is a view showing a relationship between a gas process temperature and the number of particles inside the processing chamber 101.

As shown in FIG. 12, the number of the particles scattered inside the processing chamber 101 is increased with an increase in the gas process temperature. In this measurement, the scattering of the particles was not observed until the gas process temperature becomes 350 degrees C., whereas the scattering of the particles was observed at the gas process temperature of 400 degrees C. of higher. Besides, the number of the particles at this time was a level exceeding a detection limit of a detector. The film formation temperature of the silicon film 3 was 380 degrees C. which is between 350 and 400 degrees C. It is presumed that the film formation temperature of 380 degrees C. is a threshold at which the particles are generated inside the processing chamber 101.

Figure 13:
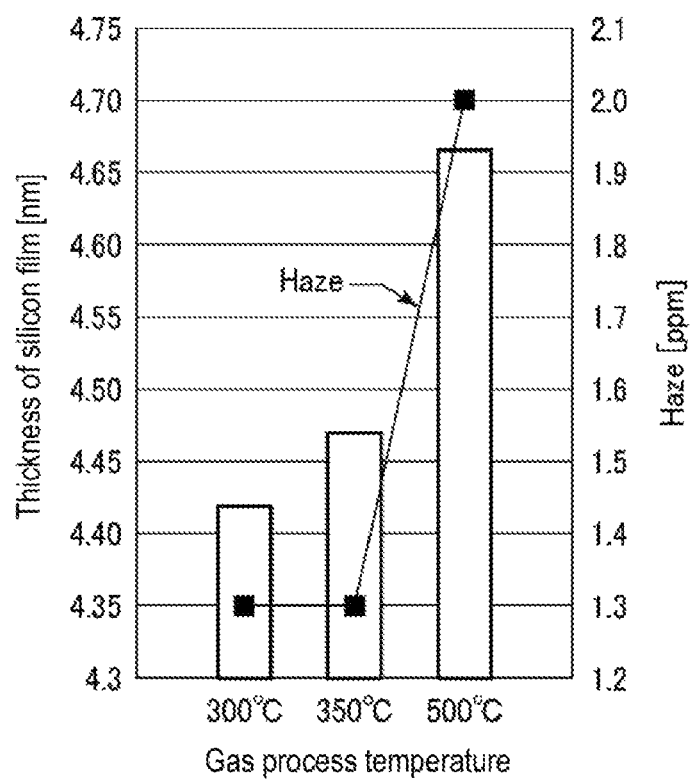
FIG. 13 is a view showing a relationship between a gas process temperature and Haze.

FIG. 13 is a view showing a relationship between a gas process temperature and Haze.

As shown in FIG. 13, when the gas process temperature is, for example, 300 degrees C. and 350 degrees C. which are equal to or less than the film formation temperature of 380 degrees C., Haze was about 1.3 ppm. And, when the gas process temperature is 500 degrees C. which exceeds the film formation temperature, Haze was increased to about 2.0 ppm. This manifests that the surface of the silicon film 3 is tarnished, thus degrading the surface roughness of the silicon film 3.

Therefore, the gas process temperature is set to be equal to or less than the film formation temperature, thus suppressing gas from being generated from the unexpected silicon film deposited inside the processing chamber 101, during the gas process. With this configuration, the scattering of the particles inside the processing chamber 101 is suppressed, thus restraining the degradation of the surface roughness.

In addition, conditions of the gas process are as follows:
Flow rate of $O_2$ gas: 1,700 sccm
Flow rate of $H_2$ gas: 1,000 sccm
Process time: 30 min
Process temperature: 300, 350, 400, 500 and 600 degrees C.
Process pressure: about 47 Pa (0.35 Torr)

Further, conditions of the silicon film formation are shown in FIGS. 12 and 13.

In addition, the unexpected silicon film deposited on the vertical wafer boat 105, the inner wall of the processing chamber 101 or the like, can be removed by performing the cleaning process. However, the cleaning process performed whenever forming the silicon film 3 results in degraded throughput. For this reason, users sometimes want to reduce the frequency of the cleaning process. To meet this, the gas process temperature is set to be equal to or less than the film formation temperature of the silicon film 3, which makes it possible to reduce the frequency of the cleaning process.

Further, in a case where a wafer boat is configured as the vertical wafer boat 105, from the viewpoint of ensuring a stable process environment inside the processing chamber 101, a wafer (hereinafter, referred to as a "prime wafer") taken for a practical usage may be mounted on the middle stage of the vertical wafer boat 105, and a dummy wafer which is not taken for the practical usage may be mounted on top and bottom stages of the wafer boat 105. In some embodiments, for example, in a state where a plurality of prime wafers is mounted on the middle stage and a plurality of dummy wafers is mounted on each of the top and bottom stages, the gas process and the film formation process of the silicon film 3 may be performed.

After the gas process and the film formation process of the silicon film 3 are completed, the prime wafers are replaced with new ones, while the dummy wafers are left without being replaced with new ones until an amount of usage thereof reaches a designed level. After the amount of usage reaches the designed level, the dummy wafers are replaced with new ones.

In other words, even if the unexpected silicon film is not deposited on the inner wall of the processing chamber 101, the surface of the vertical wafer boat 105 or the like so that the interior of the processing chamber 101 is in a clean state, the unexpected silicon film may be sometimes deposited on surfaces of the dummy wafers. The unexpected silicon films deposited on the surfaces of the dummy wafers contribute to the generation of unwanted particles inside the processing chamber 101.

As described above, from the viewpoint of using the dummy wafers to stabilize the internal process environment of the processing chamber 101, the setting of the gas process temperature equal to or less than the film formation temperature of the silicon film 3 is effective to suppress the generation of the unwanted particles.

Further, while in this embodiment, the plurality of dummy wafers has been described to be mounted on the top and bottom stages of the vertical wafer boat 105, the present disclosure is not limited thereto. In some embodiments, the dummy wafers may be mounted on the vertical wafer boat 105 in an arbitrary mounting pattern.

In some embodiments, in a case where the gas process temperature is equal to or less than the film formation temperature, the gas process temperature may be set to be more close to the film formation temperature.

Figure 14:
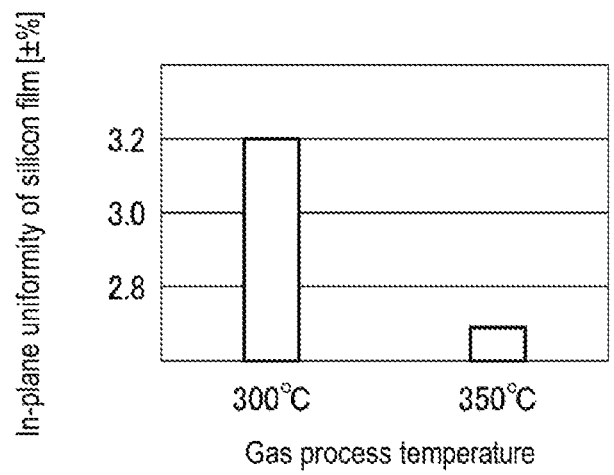
FIG. 14 is a view showing a relationship between a gas process temperature and an in-plane uniformity of a silicon film.
Figure 15:
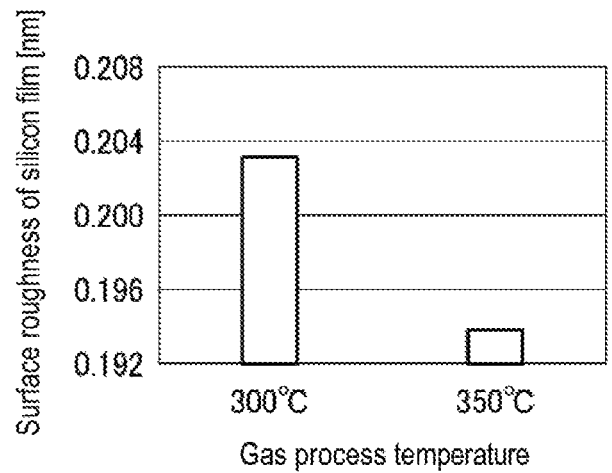
FIG. 15 is a view showing a relationship between a gas process temperature and a surface roughness Ra of a silicon film.

FIG. 14 is a view showing a relationship between a gas process temperature and an in-plane uniformity of a silicon film, and FIG. 15 is a view showing a relationship between a gas process temperature and a surface roughness Ra of a silicon film.

As shown in FIG. 14, when the film formation temperature of the silicon film 3 was 380 degrees C., the in-plane uniformity of the silicon film 3 was improved from about ±3.2% to about ±2.7% at the gas process temperature of 350 degrees C. rather than 300 degrees C.

In addition, as shown in FIG. 15, the surface roughness Ra of the silicon film 3 was also improved from about 0.203 nm to about 0.199 nm at the gas process temperature of 350 degrees C. rather than 300 degrees C.

As described above, in a case where the gas process temperature is equal to or less than the film formation temperature, the gas process temperature may be set to be more close to the film formation temperature.

In addition, conditions of the gas process are as follows:
Flow rate of $O_2$ gas: 1,700 sccm
Flow rate of $H_2$ gas: 1,000 sccm
Process time: 30 min
Process temperature: 300 or 350 degrees C.
Process pressure: about 47 Pa (0.35 Torr).
Further, conditions of the silicon film formation are shown in FIGS. 14 and 15.

<State of Target Object During Gas Process>

The wafer 1 may be in a static state during the gas process. In some embodiments, the wafer 1 may be rotated from the viewpoint of increasing the removal effect of impurities including the organic substances. Thus, the gas process may be performed while rotating the wafer 1.

In particular, as shown in the film formation apparatus 100 of FIG. 11, in a case where the $O_2$ gas and the $H_2$ gas are supplied onto the target surface of the wafer 1, it is possible to uniformly supply the $O_2$ gas and the $H_2$ gas over the entire target surface of the wafer 1 by rotating the wafer 1, compared to the case where the wafer 1 is in the static state. Therefore, it is desirable to perform the gas process while rotating the wafer 1, in the case where the $O_2$ gas and the $H_2$ gas are supplied over the entire target surface of the wafer 1.

Further, the vertical wafer boat 105 on which the wafers 1 are mounted in the height direction, is inserted into the processing chamber 101 from below. At this time, it is likely that an air flow in the vicinity of the processing chamber 101 is disturbed so that particles or impurities existing in the processing chamber 101 or the loading area part may be rolled up. Such particles or impurities are easy to adhere to edge portions of the wafers 1 mounted on the vertical wafer boat 105. In other words, the probability of the particles or the impurities existing in the wafers 1 is higher in the edge portions than the central portions thereof. A lot of the particles or the impurities which adhere to the edge portions of the wafers 1 can be more efficiently removed by performing the gas process while rotating the wafer 1, rather than leaving the wafer 1 in the static state.

Although the present disclosure has been described according to the first to third embodiments, the present disclosure is not limited thereto. A variety of modifications may be made without departing from the spirit of the disclosures.

For example, while in the above embodiments, the specific processing conditions have been described, but are not limited thereto. As an example, the processing conditions may be arbitrarily changed depending on a volume of the processing chamber 101, the process pressure of the processing chamber 101, or the like.

According to the present disclosure in some embodiments, it is possible to provide a film formation method which is capable of achieving a high precision surface roughness even if a thin silicon film is formed, and a film formation apparatus which is capable of performing the film formation method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon film on a target surface of a target object, comprising:
    performing an impurity removal process on the target surface of the target object using an oxygen gas and a hydrogen gas;
    forming the silicon film on the target surface to which the impurity removal process has been performed by supplying a silicon raw material gas to the target surface of the target object,
    wherein the performing a impurity removal process and the forming the silicon film are performed within a single processing chamber, and
    wherein after performing the impurity removal process before forming the silicon film on the target surface, the processing chamber is purged with an inert gas.

2. The method of claim 1, wherein the performing a impurity removal process and the forming the silicon film are continuously performed without exposing to an atmosphere.

3. The method of claim 1, wherein a process temperature of the impurity removal process is equal to or less than a film formation temperature of the silicon film.

4. The method of claim 3, wherein the film formation temperature of the silicon film is set to be equal to or less than 400 degrees C.

5. The method of claim 1, wherein in the performing an impurity removal process, impurities including organic substances are removed from the target surface before the forming the silicon film on the target surface.

6. The method of claim 5, wherein a process temperature of the impurity removal process is equal to or less than a film formation temperature of the silicon film.

7. The method of claim 6, wherein the process temperature of the impurity removal process falls within a range from 200 to 300 degrees C.

8. The method of claim 1, wherein a process pressure of the impurity removal process is less than a pressure applied in the forming the silicon film.

9. The method of claim 8, wherein the process pressure of the impurity removal process has a finite value of less than 399.9 Pa.

10. The method of claim 1, wherein the target object is loaded into the processing chamber while being mounted on a target object boat which is configured to mount a plurality of target objects on the target object boat,
wherein the performing an impurity removal process and the forming the silicon film are performed on the plurality of target objects within the single processing chamber.

11. The method of claim 10, wherein the target object boat is a vertical target object boat configured to mount the plurality of target objects on the vertical target object boat in a height direction.

12. The method of claim 11, wherein, in a state where a prime target object taken for a practical usage and a dummy target object not taken for the practical usage are mounted on the vertical target object boat, the performing an impurity removal process and the forming the silicon film are performed within the single processing chamber.

13. The method of claim 12, wherein the prime target object is mounted on a middle stage of the vertical target object boat, and the dummy target object is mounted on top and bottom stages of the vertical target object boat.

14. The method of claim 12, wherein the prime target object is replaced with a new one after the performing an impurity removal process and the forming the silicon film are completed, and the dummy target object is replaced with a new one after the performing an impurity removal process and the forming the silicon film are completed and after an amount of usage of the dummy target object reaches a designed level.

15. The method of claim 1, wherein the forming the silicon film is performed while rotating the target object.

16. The method of claim 15, wherein the oxygen gas and the hydrogen gas used in the forming the silicon film are supplied along the target surface of the target object.

17. The method of claim 1, wherein a film thickness of the silicon film has a finite value of 2.5 nm or less.

18. The method of claim 1, further comprising: before the performing an impurity removal process,
performing a cleaning process on the target object at a place separated from the processing chamber; and
transferring the cleaned target object from the place to the processing chamber so that the cleaned target object is loaded into the processing chamber,
wherein, after performing the cleaning process, the performing an impurity removal process and the forming the silicon film are performed on the cleaned target object loaded into the processing chamber within the single processing chamber.

* * * * *